US010381925B2

(12) United States Patent
Lee et al.

(10) Patent No.: US 10,381,925 B2
(45) Date of Patent: Aug. 13, 2019

(54) POWER SUPPLY APPARATUS AND A TEST SYSTEM INCLUDING THE SAME

(71) Applicant: SAMSUNG ELECTRONICS CO., LTD., Suwon-si, Gyeonggi-Do (KR)

(72) Inventors: Seong-Kwan Lee, Suwon-si (KR); Sung-Chul Chun, Suwon-si (KR); Sung-Yeol Kim, Yongin-si (KR); Jae-Hong Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 16 days.

(21) Appl. No.: 15/584,486

(22) Filed: May 2, 2017

(65) Prior Publication Data

US 2018/0109184 A1 Apr. 19, 2018

(30) Foreign Application Priority Data

Oct. 13, 2016 (KR) .................. 10-2016-0133090

(51) Int. Cl.

| H02M 3/156 | (2006.01) |
| G01R 1/30 | (2006.01) |
| H02M 3/02 | (2006.01) |
| H02M 1/00 | (2006.01) |

(52) U.S. Cl.
CPC .............. *H02M 3/156* (2013.01); *G01R 1/30* (2013.01); *H02M 3/02* (2013.01); *H02M 2001/008* (2013.01); *H02M 2001/0045* (2013.01); *H02M 2001/0067* (2013.01)

(58) Field of Classification Search
None
See application file for complete search history.

(56) References Cited

U.S. PATENT DOCUMENTS

| 6,900,621 | B1 | 5/2005 | Gunther | |
| 7,154,253 | B1 | 12/2006 | Gunther | |
| 9,088,176 | B2 | 7/2015 | Hendin et al. | |
| 9,787,091 | B2 * | 10/2017 | Andres | ............... H02M 3/3376 |
| 2006/0055381 | A1 * | 3/2006 | Rice | .................... H02M 3/1584 |
| | | | | 323/271 |

(Continued)

FOREIGN PATENT DOCUMENTS

| JP | 2007-244046 | 9/2007 |
| JP | 2009-157820 | 7/2009 |
| KR | 10-1029127 | 4/2011 |

*Primary Examiner* — Alex Torres-Rivera
*Assistant Examiner* — Henry E Lee, III
(74) *Attorney, Agent, or Firm* — F. Chau & Associates, LLC

(57) ABSTRACT

A power supply apparatus includes first through M-th switching regulators, first through N-th multiplexers, and first through N-th linear regulators, where each of M and N is a natural number greater than or equal to two. The first through M-th switching regulators generate first through M-th reference power signals using an input power signal. The first through N-th multiplexers select one of the first through M-th reference power signals, in response to a power selection signal, to provide first through N-th selection power signals. The first through N-th linear regulators generate first through N-th output power signals using the first through N-th selection power signals. The first through N-th linear regulators are connected to the first through N-th multiplexers, respectively.

16 Claims, 11 Drawing Sheets

(56) References Cited

U.S. PATENT DOCUMENTS

2007/0296274 A1    12/2007   Wang et al.
2009/0160251 A1    6/2009   Mok et al.
2015/0263615 A1    9/2015   Moon et al.

* cited by examiner

POWER SUPPLY APPARATUS AND A TEST SYSTEM INCLUDING THE SAME

CROSS-REFERENCE TO RELATED APPLICATION

This application claims priority under 35 U.S.C. § 119 to Korean Patent Application No. 10-2016-0133090, filed on Oct. 13, 2016 in the Korean Intellectual Property Office (KIPO), the disclosure of which is incorporated by reference herein in its entirety.

TECHNICAL FIELD

Exemplary embodiments of the inventive concept relate to power supplies, and more particularly, to power supply apparatuses and test systems including the power supply apparatuses.

DISCUSSION OF RELATED ART

Generally, power supply apparatuses are needed to supply voltages for operations of electronic circuits and/or systems. For example, a power supply apparatus may include a switching regulator having relatively high efficiency or a linear regulator having relatively high performance. A hybrid power supply apparatus that includes both the switching regulator and the linear regulator may have both relatively high efficiency and performance.

SUMMARY

According to an exemplary embodiment of the inventive concept, a power supply apparatus includes first through M-th switching regulators, first through N-th multiplexers, and first through N-th linear regulators, where each of M and N is a natural number greater than or equal to two. The first through M-th switching regulators generate first through M-th reference power signals using an input power signal. The first through N-th multiplexers select one of the first through M-th reference power signals, in response to a power selection signal, to provide first through N-th selection power signals. The first through N-th linear regulators generate first through N-th output power signals using the first through N-th selection power signals. The first through N-th linear regulators are connected to the first through N-th multiplexers, respectively.

According to an exemplary embodiment of the inventive concept, a test system includes a test controller, a plurality of devices under test (DUTs), and a power supply apparatus. The plurality of DUTs is controlled by the test controller. The power supply apparatus provides at least a part of first through N-th output power signals to each of the plurality of DUTs, where N is a natural number greater than or equal to two. The power supply apparatus includes first through M-th switching regulators, first through N-th multiplexers, and first through N-th linear regulators, where M is a natural number greater than or equal to two. The first through M-th switching regulators generate first through M-th reference power signals using an input power signal. The first through N-th multiplexers select one of the first through M-th reference power signals, in response to a power selection signal, to provide first through N-th selection power signals. The first through N-th linear regulators generate the first through N-th output power signals using the first through N-th selection power signals. The first through N-th linear regulators are connected to the first through N-th multiplexers, respectively.

According to an exemplary embodiment of the inventive concept, in a method of controlling a power supply apparatus, values of first through N-th output power signals to be provided by first through N-th linear regulators are set in response to an output control signal, where N is a natural number greater than or equal to two. Values of first through M-th reference power signals to be provided by first through M-th switching regulators are set in response to a reference control signal, where M is a natural number greater than or equal to two. A power selection signal is set such that each of first through N-th multiplexers provides one of the first through M-th reference power signals as a selection power signal to one of the first through N-th linear regulators.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
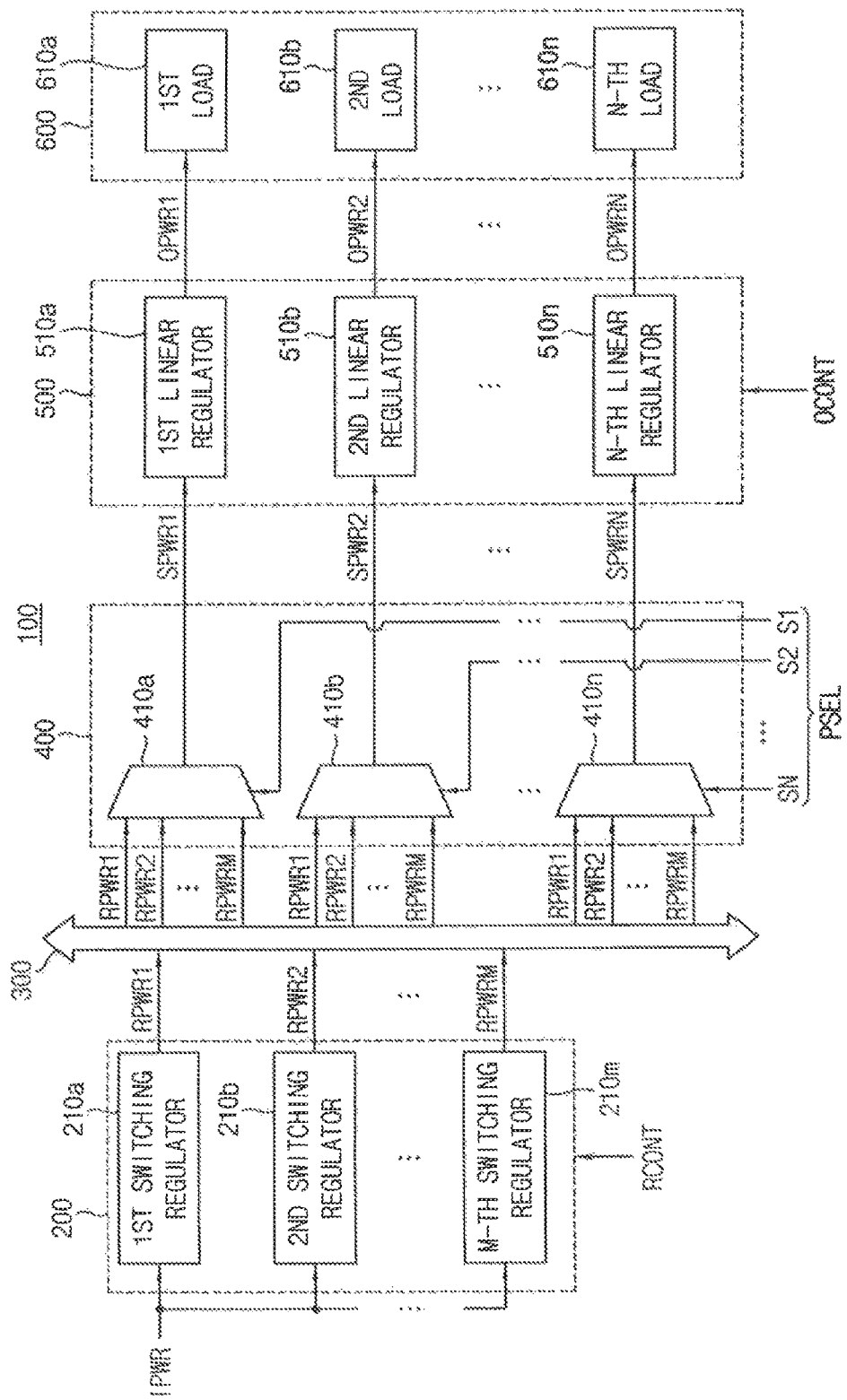
FIG. 1 is a block diagram illustrating a power supply apparatus according to an exemplary embodiment of the inventive concept.

Exemplary embodiments of the inventive concept will be described more fully hereinafter with reference to the accompanying drawings. Like reference numerals may refer to like elements throughout the accompanying drawings.

Exemplary embodiments of the inventive concept provide a power supply apparatus having a multi-channel structure, a relatively small size, and relatively increased performance.

Exemplary embodiments of the inventive concept also provide a test system including the above-described power supply apparatus.

FIG. 1 is a block diagram illustrating a power supply apparatus according to an exemplary embodiment of the inventive concept.

Referring to FIG. 1, a power supply apparatus 100 includes a first power generation unit 200, a selection unit 400, and a second power generation unit 500. The power supply apparatus 100 may further include a power rail 300 and a load unit 600.

The first power generation unit 200 includes first through M-th switching regulators 210a, 210b, ..., 210m, where M is a natural number greater than or equal to two. The first through M-th switching regulators 210a~210m generate first through M-th reference power signals RPWR1, RPWR2, ..., RPWRM based on an input power signal IPWR. For example, the first switching regulator 210a may generate the first reference power signal RPWR1 based on the input power signal IPWR. The second switching regulator 210b may generate the second reference power signal RPWR2 based on the input power signal IPWR. The M-th switching regulator 210m may generate the M-th reference power signal RPWRM based on the input power signal IPWR. For example, the input power signal IPWR may be a voltage value, and thus, each of the reference power signals RPWR1~RPWRM may also be a voltage value.

Typically, a switching regulator includes at least one switching element, and an output voltage of the switching regulator is controlled by rapidly and repeatedly turning on and off the switching element. The switching regulator may have higher efficiency and less heat generation, but may have a complicated structure and electrical noise caused by the switching operations.

The selection unit 400 includes first through N-th multiplexers 410a, 410b, ..., 410n, where N is a natural number greater than or equal to two. Each of the first through N-th multiplexers 410a~410n select one of the first through M-th reference power signals RPWR1~RPWRM based on a power selection signal PSEL to provide first through N-th selection power signals SPWR1, SPWR2, ..., SPWRN, respectively. The power selection signal PSEL may include first through N-th selection signals S1, S2, ..., SN. For example, the first multiplexer 410a may output one of the first through M-th reference power signals RPWR1~RPWRM as the first selection power signal SPWR1 based on the first selection signal S1. The second multiplexer 410b may output one of the first through M-th reference power signals RPWR1~RPWRM as the second selection power signal SPWR2 based on the second selection signal S2. The N-th multiplexer 410n may output one of the first through M-th reference power signals RPWR1~RPWRM as the N-th selection power signal SPWRN based on the N-th selection signal SN. For example, each of the first through N-th selection power signals SPWR1~SPWRN may also be a voltage value.

The second power generation unit 500 includes first through N-th linear regulators 510a, 510b, ..., 510n. The first through N-th linear regulators 510a~510n are connected to the first through N-th multiplexers 410a~410n, respectively. The first through N-th linear regulators 510a~510n generate first through N-th output power signals OPWR1, OPWR2, ..., OPWRN, respectively, based on the first through N-th selection power signals SPWR1~SPWRN received from the first through N-th multiplexers 410a~410n. For example, the first linear regulator 510a may be connected to the first multiplexer 410a, and may generate the first output power signal OPWR1 based on the first selection power signal SPWR1. The second linear regulator 510b may be connected to the second multiplexer 410b, and may generate the second output power signal OPWR2 based on the second selection power signal SPWR2. The N-th linear regulator 510n may be connected to the N-th multiplexer 410n, and may generate the N-th output power signal OPWRN based on the N-th selection power signal SPWRN. For example, each of the first through N-th output power signals OPWR1~OPWRN may also be a voltage value.

Typically, a linear regulator has a linear relationship between an input voltage and an output voltage. Unlike a switching regulator, an output voltage of the linear regulator is controlled without switching operations. The linear regulator may have a simple structure and reduced noise, but may have lower efficiency and more heat generation.

According to exemplary embodiments of the inventive concept, power loss dissipated by the linear regulator may increase in proportion to a voltage difference between an output and an input of the linear regulator. For example, a first power loss dissipated by the first linear regulator 510a may increase in proportion to a voltage difference between the first output power signal OPWR1 and the first selection power signal SPWR1.

According to exemplary embodiments of the inventive concept, as will be described below with reference to FIGS. 2 through 6, values of the first through M-th reference power signals RPWR1~RPWRM may be set based on a reference control signal RCONT, and values of the first through N-th output power signals OPWR1~OPWRN may be set based on an output control signal OCONT. For example, the values of the first through N-th output power signals OPWR1~OPWRN may be set first. The values of the first through M-th reference power signals RPWR1~RPWRM may be set after the values of the first through N-th output power signals OPWR1~OPWRN are set, such that the whole or overall voltage differences (e.g., dropouts) between outputs and inputs of the first through N-th linear regulators 510a~510n are optimized.

According to exemplary embodiments of the inventive concept, the reference control signal RCONT, the power selection signal PSEL, and the output control signal OCONT may be received from an external device (e.g., an external controller).

The power rail 300 may provide all of the first through M-th reference power signals RPWR1~RPWRM to each of the first through N-th multiplexers 410a~410n. For example, the power rail 300 may include N*M power wirings. For example, the N*M power wirings may include M power wirings that provide the first reference power signal RPWR1 to the first through N-th multiplexers 410a~410n, M power wirings that provide the second reference power signal RPWR2 to the first through N-th multiplexers 410a~410n, M power wirings that provide the M-th reference power signal RPWRM to the first through N-th multiplexers 410a~410n, and the like.

The load unit 600 may include first through N-th loads 610a, 610b, ..., 610n. The first through N-th loads 610a~610n may be connected to the first through N-th linear regulators 510a~510n, respectively. The first through N-th loads 610a~610n may receive the first through N-th output power signals OPWR1~OPWRN. For example, the first load 610a may be connected to the first linear regulator 510a, and may receive the first output power signal OPWR1 from the first linear regulator 510a. The second load 610b may be connected to the second linear regulator 510b, and may receive the second output power signal OPWR2 from the second linear regulator 510b. The N-th load 610n may be connected to the N-th linear regulator 510n, and may receive the N-th output power signal OPWRN from the N-th linear regulator 510n.

According to exemplary embodiments of the inventive concept, the number of the first through M-th switching regulators 210a~210m may be different from the number of the first through N-th linear regulators 510a~510n. In other words, the number of channels for the first through M-th switching regulators 210a~210m may be different from the number of channels for the first through N-th linear regulators 510a~510n, and N may be a natural number different from M.

According to exemplary embodiments of the inventive concept, the number of the first through N-th linear regulators 510a~510n may be greater than the number of the first through M-th switching regulators 210a~210m. In other words, the number of the channels for the first through N-th linear regulators 510a~510n may be greater than the number of the channels for the first through M-th switching regulators 210a~210m, and N may be a natural number greater than M.

According to exemplary embodiments of the inventive concept, the number of the first through M-th switching regulators 210a~210m may be substantially the same as the number of the first through N-th linear regulators 510a~510n.

The power supply apparatus 100 according to exemplary embodiments of the inventive concept may be a hybrid power supply apparatus in which the first through M-th switching regulators 210a~210m and the first through N-th linear regulators 510a~510n are connected in parallel with each other and are connected based on a multi-channel structure. To provide an optimized input to each of the first through N-th linear regulators 510a~510n, the power supply apparatus 100 may include the first through N-th multiplexers 410a~410n of which the number is substantially the same as that of the first through N-th linear regulators 510a~510n. Accordingly, the power supply apparatus 100 may have higher efficiency, less heat generation, a small size, and a simple structure, and may have increased performance by optimizing the whole or overall dropouts of the first through N-th linear regulators 510a~510n.

FIGS. 2, 3, 4, 5, and 6 are diagrams for describing an operation of a power supply apparatus according to an exemplary embodiment of the inventive concept. FIGS. 2, 3, 4, 5, and 6 illustrate an example where a power supply apparatus according to an exemplary embodiment of the inventive concept includes four switching regulators SR1, SR2, SR3, and SR4 and seven linear regulators LR1, LR2, LR3, LR4, LR5, LR6, and LR7. With reference to FIGS. 2, 3, 4, 5, and 6, operations of setting values of output power signals OPWR1, OPWR2, OPWR3, OPWR4, OPWR5, OPWR6, and OPWR7 and reference power signals RPWR1, RPWR2, RPWR3, and RPWR4 and setting selection signals S1, S2, S3, S4, S5, S6, and S7 and selection power signals SPWR1, SPWR2, SPWR3, SPWR4, SPWR5, SPWR6, and SPWR7 will be described.

Figure 2:
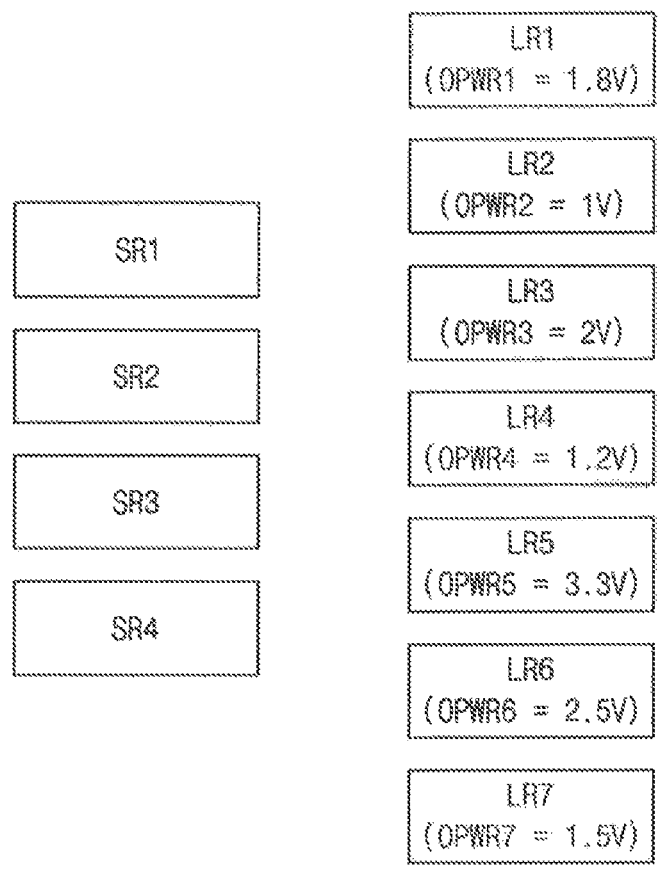
FIGS. 2, 3, 4, 5, and 6 are diagrams for describing an operation of a power supply apparatus according to an exemplary embodiment of the inventive concept.

Referring to FIG. 2, the values of the output power signals OPWR1~OPWR7 for the linear regulators LR1~LR7 may be set first based on the output control signal OCONT in FIG. 1. For example, the value of the first output power signal OPWR1 for the first linear regulator LR1 may be set to about 1.8V. The value of the second output power signal OPWR2 for the second linear regulator LR2 may be set to about 1V. The value of the third output power signal OPWR3 for the third linear regulator LR3 may be set to about 2V. The value of the fourth output power signal OPWR4 for the fourth linear regulator LR4 may be set to about 1.2V. The value of the fifth output power signal OPWR5 for the fifth linear regulator LR5 may be set to about 3.3V. The value of the sixth output power signal OPWR6 for the sixth linear regulator LR6 may be set to about 2.5V. The value of the seventh output power signal OPWR7 for the seventh linear regulator LR7 may be set to about 1.5V.

According to exemplary embodiments of the inventive concept, as illustrated in FIG. 2, all of the output power signals OPWR1~OPWR7 for the linear regulators LR1~LR7 may be set to have different values. According to exemplary embodiments of the inventive concept, at least two of the output power signals OPWR1~OPWR7 for the linear regulators LR1~LR7 may be set to have the same value.

Figure 3:
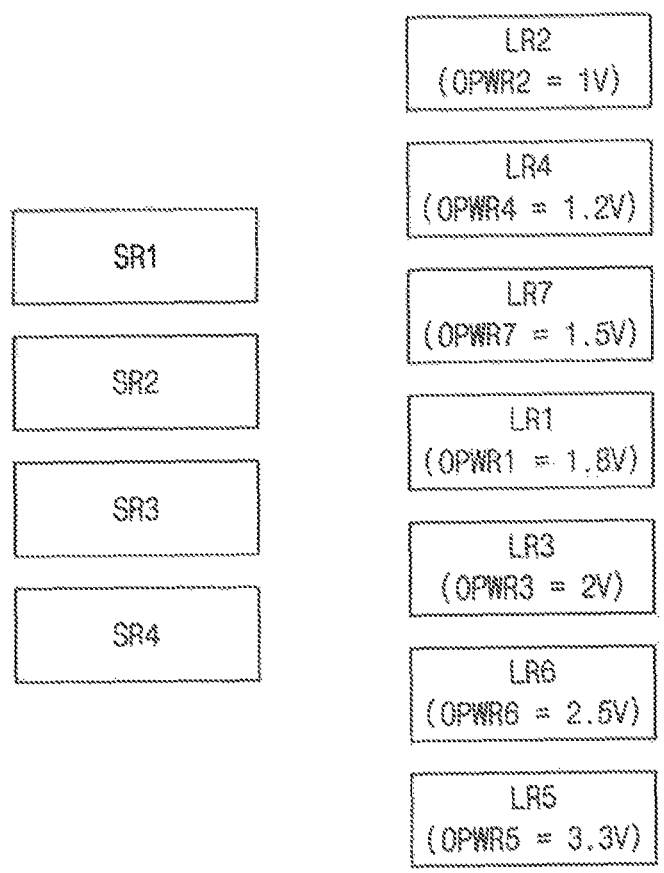
Figure 4:
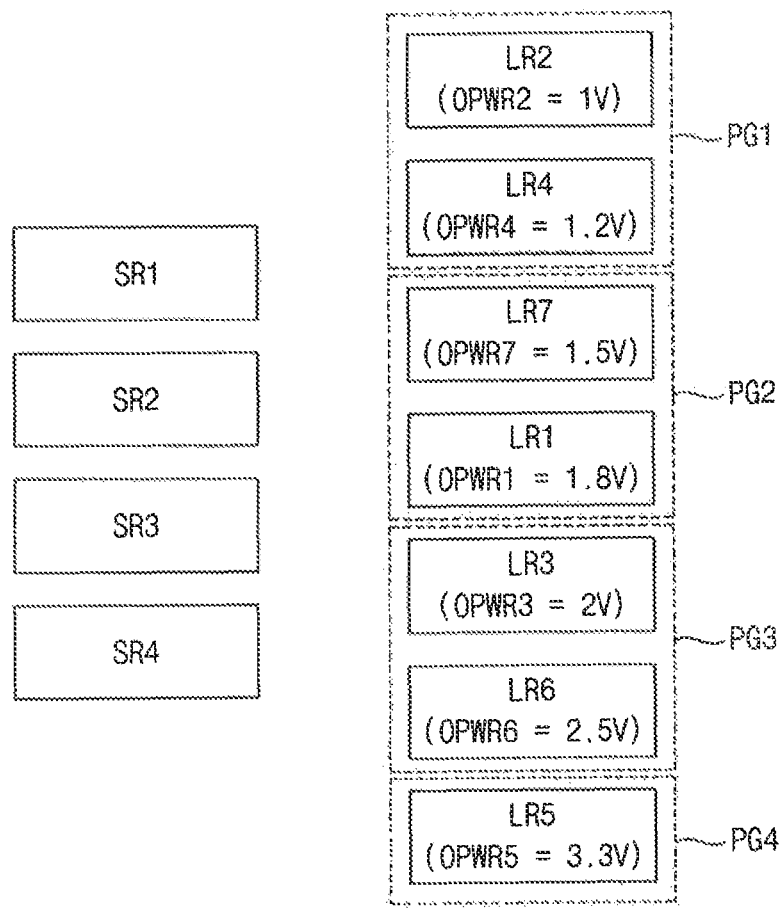

Referring to FIGS. 3 and 4, after the values of the output power signals OPWR1~OPWR7 are set, the output power signals OPWR1~OPWR7 may be divided into power signal groups PG1, PG2, PG3, and PG4.

As illustrated in FIG. 3, to divide the output power signals OPWR1~OPWR7 into the power signal groups PG1~PG4, the output power signals OPWR1~OPWR7 may be sorted based on a predetermined first criterion, rule, condition, etc.

According to exemplary embodiments of the inventive concept, the first criterion may be associated with the values of the output power signals OPWR1~OPWR7. In other words, the output power signals OPWR1~OPWR7 may be sorted in order of their values. For example, as illustrated in FIG. 3, the output power signals OPWR1~OPWR7 may be sorted in ascending order from the second output power signal OPWR2 having a smallest value (e.g., about 1V) to the fifth output power signal OPWR5 having a greatest value (e.g., about 3.3V). As another example, the output power signals OPWR1~OPWR7 may be sorted in descending order.

According to exemplary embodiments of the inventive concept, the first criterion may be one of various criteria for optimizing arrangements. The output power signals may be sorted according to different criteria to optimize their arrangement.

As illustrated in FIG. 4, the sorted output power signals OPWR1~OPWR7 may be divided into the power signal groups PG1~PG4 based on a predetermined second criterion. The number of the power signal groups PG1~PG4 may be substantially the same as the number of the switching regulators SR1~SR4.

According to exemplary embodiments of the inventive concept, each of the power signal groups PG1~PG4 may include at least one of the output power signals OPWR1~OPWR7. For example, as illustrated in FIG. 4, the first power signal group PG1 may include the second and fourth output power signals OPWR2 and OPWR4. The second power signal group PG2 may include the first and seventh output power signals OPWR1 and OPWR7. The third power signal group PG3 may include the third and sixth output power signals OPWR3 and OPWR6. The fourth power signal group PG4 may include the fifth output power signal OPWR5. In other words, a power signal group that does not include any output power signals may not exist.

According to exemplary embodiments of the inventive concept, when the output power signals OPWR1~OPWR7 are sorted in order of their values, one of a minimum output power signal and a maximum output power signal may be included in a first power signal group, and the other of the minimum output power signal and the maximum output power signal may be included in a last power signal group. The minimum output power signal may have a smallest value among the output power signals OPWR1~OPWR7, and the maximum output power signal may have a greatest value among the output power signals OPWR1~OPWR7. For example, as illustrated in FIGS. 3 and 4, when the output power signals OPWR1~OPWR7 are sorted in ascending order, the minimum output power signal having the smallest value (e.g., the second output power signal OPWR2 of about 1V) may be included in the first power signal group (e.g., the first power signal group PG1), and the maximum output power signal having the greatest value (e.g., the fifth output power signal OPWR5 of about 3.3V) may be included in the last power signal group (e.g., the fourth power signal group PG4).

As another example, when the output power signals are sorted in descending order, the maximum output power signal may be included in the first power signal group, and the minimum output power signal may be included in the last power signal group.

According to exemplary embodiments of the inventive concept, the second criterion may be associated with the number of output power signals included in each power signal group. For example, the output power signals OPWR1~OPWR7 may be grouped such that the numbers of output power signals in power signal groups are substantially the same as each other. For example, as illustrated in FIG. 4, when seven output power signals OPWR1~OPWR7 are divided into four power signal groups PG1~PG4, each power signal group may include one output power signal or two output power signals because seven divided by four is 1.75.

According to exemplary embodiments of the inventive concept, the second criterion may be associated with the values of the output power signals OPWR1~OPWR7. For example, the output power signals OPWR1~OPWR7 may be grouped based on at least one threshold value. For example, as illustrated in FIG. 4, when seven output power signals OPWR1~OPWR7 are divided into four power signal groups PG1~PG4, three threshold values may be set, and first, second, and third threshold values may be set to about 1.5V, 2V, and 3V, respectively. At least one output power signal (e.g., the second and fourth output power signals OPWR2 and OPWR4) that is less than the first threshold value may be included in the first power signal group PG1. At least one output power signal (e.g., the first and seventh output power signals OPWR1 and OPWR7) that is greater than or equal to the first threshold value and is less than the second threshold value may be included in the second power signal group PG2. At least one output power signal (e.g., the third and sixth output power signals OPWR3 and OPWR6) that is greater than or equal to the second threshold value and is less than the third threshold value may be included in the third power signal group PG3. At least one output power signal (e.g., the fifth output power signal OPWR5) that is greater than or equal to the third threshold value may be included in the fourth power signal group PG4.

According to exemplary embodiments of the inventive concept, the second criterion may be one of various criteria for optimizing groupings. The output power signals may be grouped according to various criteria to optimize their grouping.

Figure 5:
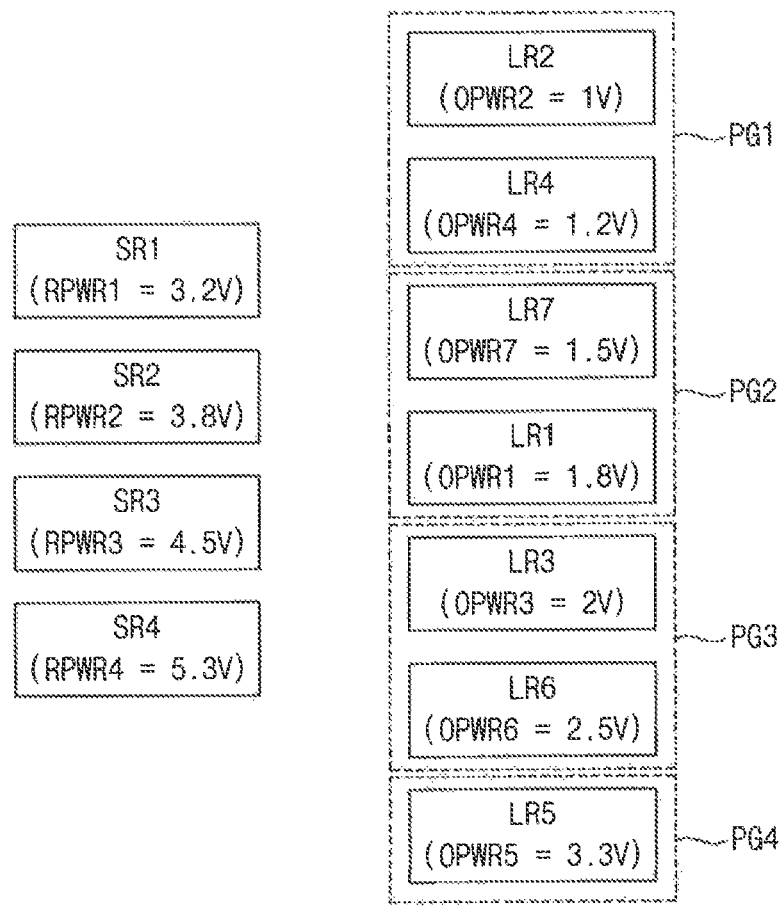

Referring to FIG. 5, after the output power signals OPWR1~OPWR7 are divided into the power signal groups PG1~PG4, the values of the reference power signals RPWR1~RPWR4 for the power signal groups PG1~PG4 may be set based on the reference control signal RCONT in FIG. 1. For example, the first reference power signal RPWR1 for the first power signal group PG1 may be set to about 3.2V. The second reference power signal RPWR2 for the second power signal group PG2 may be set to about 3.8V. The third reference power signal RPWR3 for the third power signal group PG3 may be set to about 4.5V. The fourth reference power signal RPWR4 for the fourth power signal group PG4 may be set to about 5.3V. The values of the reference power signals RPWR1~RPWR4 may be set based on a predetermined third criterion.

According to exemplary embodiments of the inventive concept, the third criterion may be associated with values of output power signals included in each power signal group. For example, a value of each reference power signal may be set to be greater than a value of a maximum output power signal that has a greatest value among output power signals included in each power signal group, and the value of each reference power signal may be obtained by adding an offset value to the value of the maximum output power signal. For example, as illustrated in FIG. 5, the offset value may be about 2V. The first reference power signal RPWR1 of about 3.2V may be obtained by adding the offset value to a value of a first maximum output power signal (e.g., the fourth output power signal OPWR4 of about 1.2V) in the first power signal group PG1. The second reference power signal RPWR2 of about 3.8V may be obtained by adding the offset value to a value of a second maximum output power signal (e.g., the first output power signal OPWR1 of about 1.8V) in the second power signal group PG2. The third reference power signal RPWR3 of about 4.5V may be obtained by adding the offset value to a value of a third maximum output power signal (e.g., the sixth output power signal OPWR6 of about 2.5V) in the third power signal group PG3. The fourth reference power signal RPWR4 of about 5.3V may be obtained by adding the offset value to a value of a fourth maximum output power signal (e.g., the fifth output power signal OPWR5 of about 3.3V) in the fourth power signal group PG4.

According to exemplary embodiments of the inventive concept, the third criterion may be one of various criteria for optimizing efficiencies and minimizing dropouts. The output power signals may be set according to various criteria to achieve the optimized efficiencies and minimized dropouts.

Figure 6:
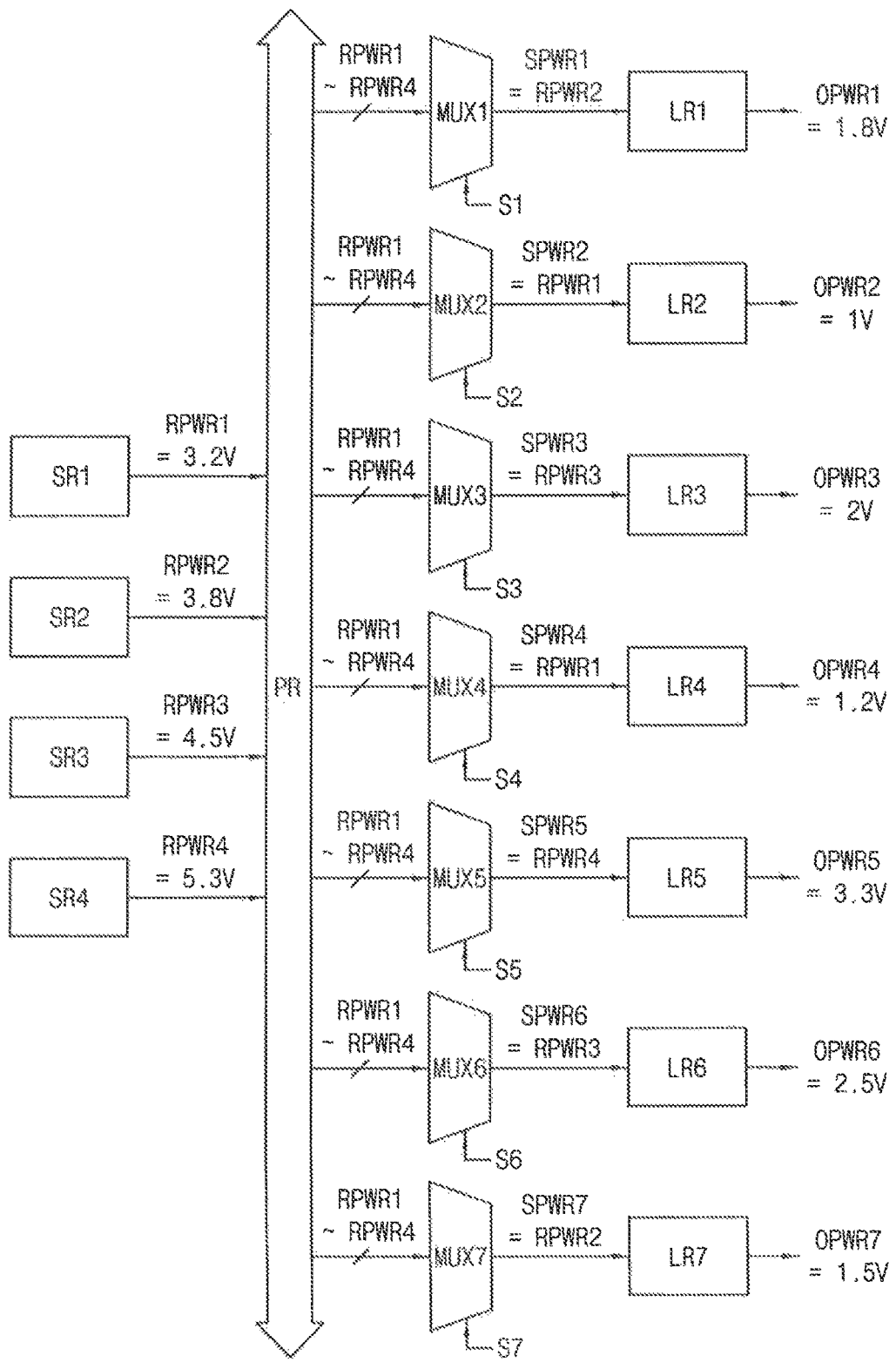

Referring to FIG. 6, after the values of the output power signals OPWR1~OPWR7 and the values of the reference power signals RPWR1~RPWR4 are set, the selection signals S1~S7 may be set such that multiplexers MUX1, MUX2, MUX3, MUX4, MUX5, MUX6, and MUX7 provide the selection power signals SPWR1~SPWR7, respectively, that are optimized for the linear regulators LR1~LR7.

For example, the first selection signal S1 may be set such that the first multiplexer MUX1 outputs the second reference power signal RPWR2, among the reference power signals RPWR1~RPWR4 that are transmitted through a power rail PR, as the first selection power signal SPWR1. The second selection signal S2 may be set such that the second multiplexer MUX2 outputs the first reference power signal RPWR1 as the second selection power signal SPWR2. The third selection signal S3 may be set such that the third multiplexer MUX3 outputs the third reference power signal RPWR3 as the third selection power signal SPWR3. The fourth selection signal S4 may be set such that the fourth multiplexer MUX4 outputs the first reference power signal RPWR1 as the fourth selection power signal SPWR4. The fifth selection signal S5 may be set such that the fifth multiplexer MUX5 outputs the fourth reference power signal RPWR4 as the fifth selection power signal SPWR5. The sixth selection signal S6 may be set such that the sixth multiplexer MUX6 outputs the third reference power signal RPWR3 as the sixth selection power signal SPWR6. The seventh selection signal S7 may be set such that the seventh multiplexer MUX7 outputs the second reference power signal RPWR2 as the seventh selection power signal SPWR7.

In other words, each of the multiplexers MUX1~MUX7 may electrically connect a respective one of the linear regulators LR1~LR7 with one of the switching regulators SR1~SR4 based on the selection signals S1~S7 such that each of the linear regulators LR1~LR7 receives an optimized reference power signal as an optimized input. For example, the second and fourth linear regulators LR2 and LR4 associated with the first power signal group PG1 may be electrically connected to the first switching regulator SR1 through the second and fourth multiplexers MUX2 and MUX4, respectively, and thus, the efficiencies and dropouts of the second and fourth linear regulators LR2 and LR4 may be optimized. The first and seventh linear regulators LR1 and LR7 associated with the second power signal group PG2 may be electrically connected to the second switching regulator SR2 through the first and seventh multiplexers MUX1 and MUX7, respectively, and thus, the efficiencies and dropouts of the first and seventh linear regulators LR1 and LR7 may be optimized. The third and sixth linear regulators LR3 and LR6 associated with the third power signal group PG3 may be electrically connected to the third switching regulator SR3 through the third and sixth multiplexers MUX3 and MUX6, respectively, and thus, the efficiencies and dropouts of the third and sixth linear regulators LR3 and LR6 may be optimized. The fifth linear regulator LR5 associated with the fourth power signal group PG4 may be electrically connected to the fourth switching regulator SR4 through the fifth multiplexer MUX5, and thus, the efficiency and dropout of the fifth linear regulator LR5 may be optimized.

According to exemplary embodiments of the inventive concept, each of the selection signals S1~S7 may be a binary signal, and the number of bits included in the binary signal may be substantially the same as the number of the power signal groups PG1~PG4 and the number of the switching regulators SR1~SR4. In the example of FIG. 6, each of the selection signals S1~S7 may be a binary signal having four bits, and a reference power signal corresponding to a logic high level (e.g., "1") may be output as a selection power signal. For example, to output the first reference power signal RPWR1, the second and fourth selection signals S2 and S4 may be set to "0001" in which only a least significant bit (LSB) is the logic high level. To output the second reference power signal RPWR2, the first and seventh selection signals S1 and S7 may be set to "0010" in which only a second LSB is the logic high level. To output the fourth reference power signal RPWR4, the fifth selection signal S5 may be set to "1000" in which only a most significant bit (MSB) is the logic high level. To output the third reference power signal RPWR3, the third and sixth selection signals S3 and S6 may be set to "0100" in which only a second MSB is the logic high level.

The linear regulators LR1~LR7 may generate the output power signals OPWR1~OPWR7 based on the selection power signals SPWR1~SPWR7 that are optimized for the linear regulators LR1~LR7 (e.g., that have optimized dropouts), and thus, the power supply apparatus 100 may have increased performance and efficiency.

Although FIGS. 2 through 6 illustrate an example of setting the reference power signals RPWR1~RPWR4, the selection power signals SPWR1~SPWR7, and the output power signals OPWR1~OPWR7, at least one of the reference power signals, the selection power signals, and the output power signals may be variable according to an exemplary embodiment of the inventive concept. In other words, in the power supply apparatus 100 according to an exemplary embodiment of the inventive concept, target power signals (e.g., the output power signals) to be generated by the power supply apparatus 100 may be changed depending on applications and/or operating circumstances or environments. When the target power signals are changed, the power supply apparatus 100 may be dynamically controlled for optimizing the reference power signals, the selection power signals, and the output power signals.

Although FIGS. 2 through 6 illustrate an example where the power supply apparatus 100 includes a specific number of circuits, a specific number of signals, and specific values of signals, the number of regulators, the number of multiplexers, the number and the values of power signals, and the number and the values of selection signals may be changed according to exemplary embodiments of the inventive concept.

Figure 7:
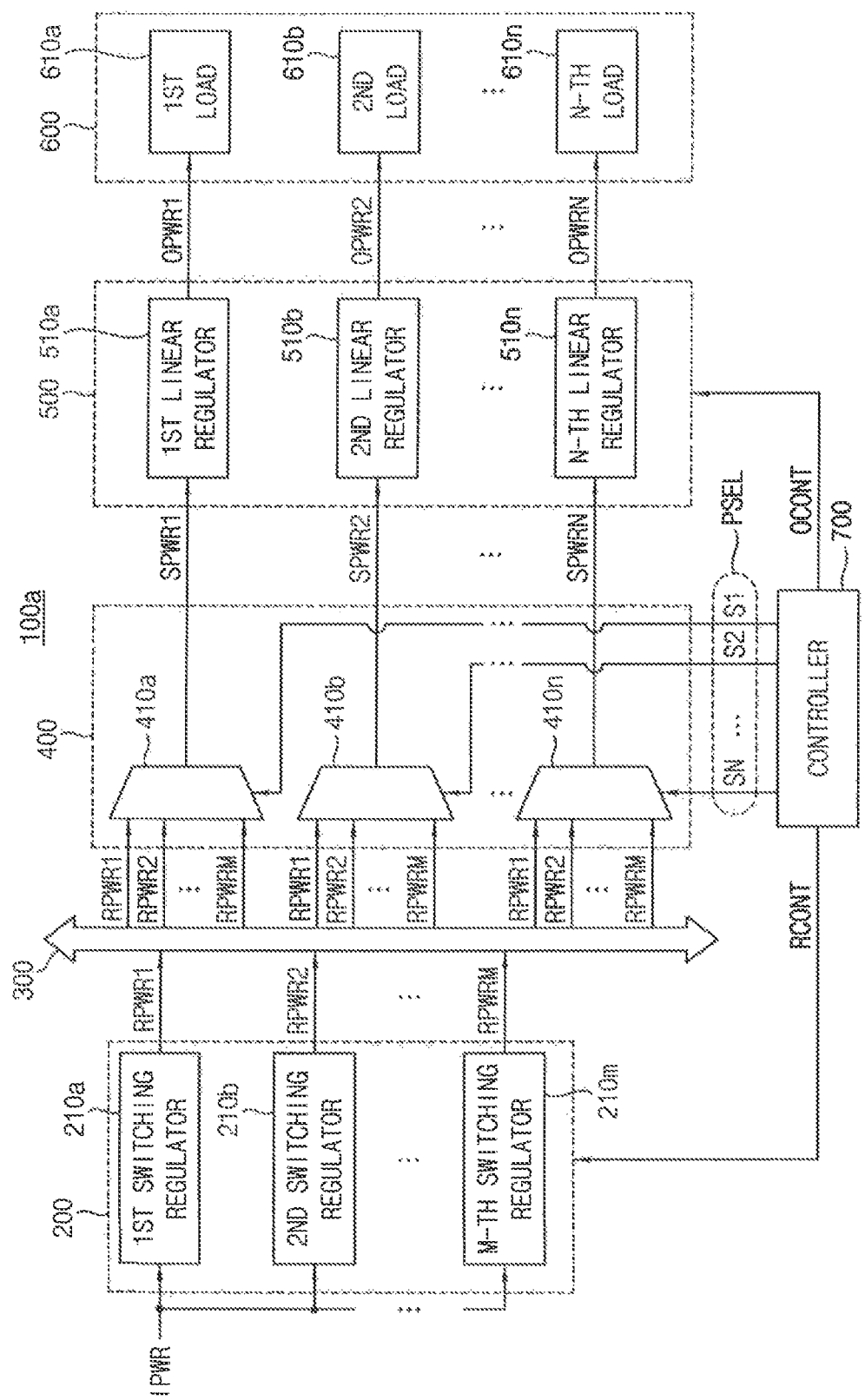
FIG. 7 is a block diagram illustrating a power supply apparatus according to an exemplary embodiment of the inventive concept.

FIG. 7 is a block diagram illustrating a power supply apparatus according to an exemplary embodiment of the inventive concept.

Referring to FIG. 7, a power supply apparatus 100a includes the first power generation unit 200, the selection unit 400 and the second power generation unit 500. The power supply apparatus 100a may further include the power rail 300, the load unit 600, and a controller 700.

The power supply apparatus 100a of FIG. 7 may be substantially the same as the power supply apparatus 100 of FIG. 1, except that the power supply apparatus 100a of FIG. 7 further includes the controller 700.

The controller 700 may generate the reference control signal RCONT, the power selection signal PSEL, and the output control signal OCONT. The values of the first through M-th reference power signals RPWR1~RPWRM may be set based on the reference control signal RCONT. The values of the first through N-th output power signals OPWR1~OPWRN may be set based on the output control signal OCONT. The selection power signals SPWR1~SPWRN that are output from the first through N-th multiplexers 410a-4l On, respectively, may be determined based on the power selection signal PSEL. For example, the output power signals, the reference power signals, and the selection power signals may be set as described with reference to FIGS. 2 through 6.

According to exemplary embodiments of the inventive concept, at least one of the reference power signals RPWR1~RPWRM, the selection power signals SPWR1~SPWRN, and the output power signals OPWR1~OPWRN may be variable based on the reference control signal RCONT, the power selection signal PSEL, and the output control signal OCONT. When the output power signals OPWR1~OPWRN are changed depending on applications and/or operating circumstances or environments, the power supply apparatus 100a may be dynamically controlled for optimizing the reference power signals RPWR1~RPWRM, the selection power signals SPWR1~SPWRN, and the output power signals OPWR1~OPWRN.

Figure 8A:
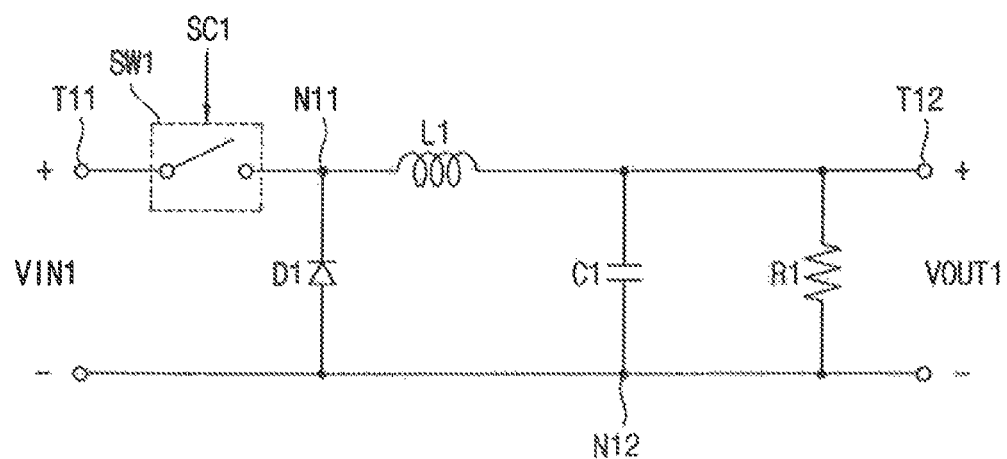
FIGS. 8A, 8B, and 8C are circuit diagrams illustrating a regulator included in a power supply apparatus according to exemplary embodiments of the inventive concept.
Figure 8B:
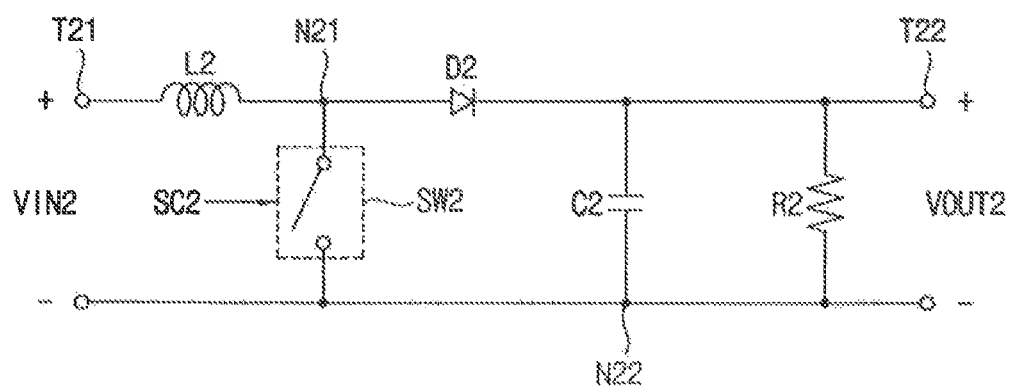
Figure 8C:
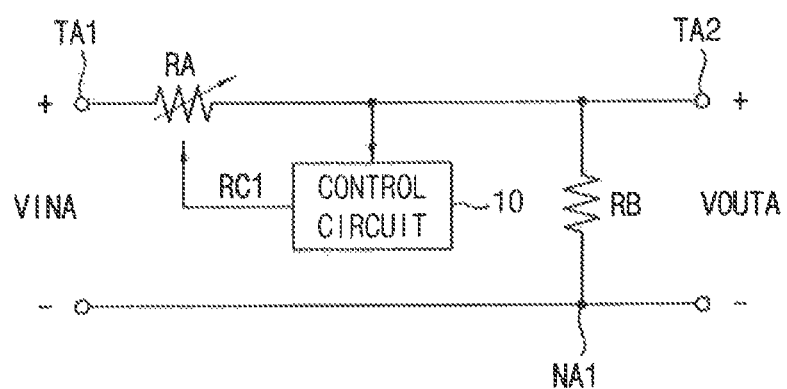

FIGS. 8A, 8B, and 8C are circuit diagrams illustrating a regulator included in a power supply apparatus according to exemplary embodiments of the inventive concept. FIGS. 8A and 8B illustrate examples of a switching regulator. FIG. 8C illustrates an example of a linear regulator.

A switching regulator may include a DC-DC (direct current) converter in which both an input and an output are a DC voltage. For example, the DC-DC converter may include a buck converter (or a step-down converter), a boost converter (or a step-up converter), a buck-boost converter in which the buck converter and the boost converter are combined, an isolated DC-DC converter, etc.

Referring to FIG. 8A, a buck converter, which is a type of DC-DC converter, may include a switch SW1, a diode D1, an inductor L1, a capacitor C1, and a resistor R1.

The switch SW1 may be connected between a first terminal T11 and a first node N11, and may be turned on or off in response to a switch control signal SC1. The diode D1 may be connected between the first node N11 and a second node N12. The inductor L1 may be connected between the first node N11 and a second terminal T12. The capacitor C1 and the resistor R1 may be connected in parallel between the second terminal T12 and the second node N12. In the buck converter of FIG. 8A, an output voltage VOUT1 between the second terminal T12 and the second node N12 may be less than an input voltage VIN1 between the first terminal T11 and the second node N12.

Referring to FIG. 8B, a boost converter, which is another type of DC-DC converter, may include an inductor L2, a switch SW2, a diode D2, a capacitor C2, and a resistor R2.

The inductor L2 may be connected between a first terminal T21 and a first node N21. The switch SW2 may be connected between the first node N21 and a second node N22, and may be turned on or off in response to a switch control signal SC2. The diode D2 may be connected between the first node N21 and a second terminal T22. The capacitor C2 and the resistor R2 may be connected in parallel between the second terminal T22 and the second node N22. In the boost converter of FIG. 8B, an output voltage VOUT2 between the second terminal T22 and the second node N22 may be greater than an input voltage VIN2 between the first terminal T21 and the second node N22.

According to exemplary embodiments of the inventive concept, the switch control signal SC1 in FIG. 8A and/or the switch control signal SC2 in FIG. 8B may be generated based on a pulse width modulation (PWM) scheme or a pulse frequency modulation (PFM) scheme. According to exemplary embodiments of the inventive concept, the switch control signal SC1 in FIG. 8A and/or the switch control signal SC2 in FIG. 8B may be generated based on a feedback signal that is retrieved from the second terminal T12 in FIG. 8A and/or the second terminal T22 in FIG. 8B.

A linear regulator may include a shunt regulator, a series regulator, a low dropout (LDO) regulator, etc.

Referring to FIG. 8C, a linear regulator may include resistors RA and RB and a control circuit 10.

The resistor RA may be connected between a first terminal TA1 and a second terminal TA2, and may be a variable resistor. The resistor RB may be connected between the second terminal TA2 and a first node NA1. The control circuit 10 may generate a resistor control signal RC1 based on a feedback signal that is retrieved from the second terminal TA2. A resistance of the resistor RA may be adjusted in response to the resistor control signal RC1. In the linear converter of FIG. 8C, an output voltage VOUTA between the second terminal TA and the first node NA1 may be less than an input voltage VINA between the first terminal TA1 and the first node NA1.

As described above, FIGS. 8A and 8B illustrate examples of a switching regulator, and FIG. 8C illustrates an example of a linear regulator. However, the inventive concept is not limited thereto, and configurations of the switching regulator and/or the linear regulator may be changed.

Figure 9:
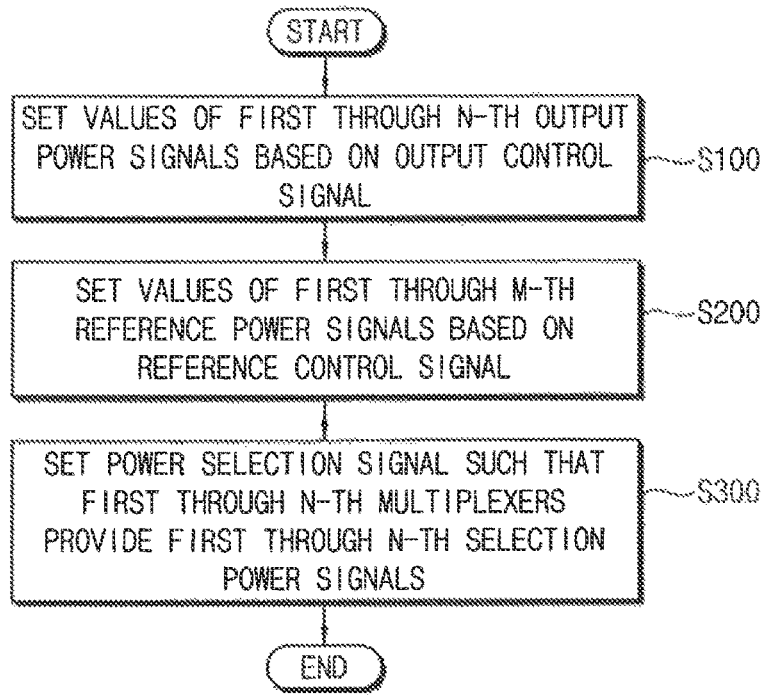
FIG. 9 is a flowchart illustrating a method of controlling a power supply apparatus according to an exemplary embodiment of the inventive concept.
Figure 10:
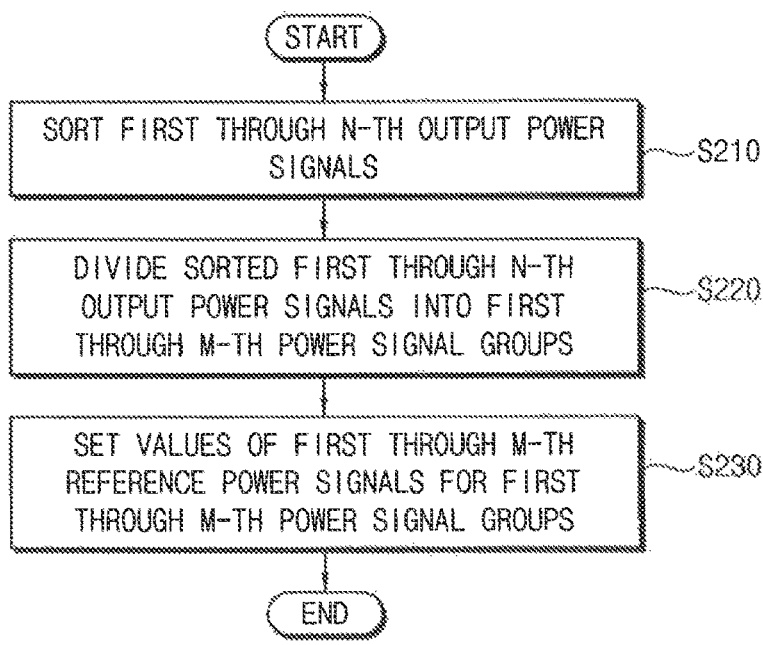
FIG. 10 is a flowchart illustrating operations to set values of first through M-th reference power signals in the method of FIG. 9 according to an exemplary embodiment of the inventive concept.

FIG. 9 is a flowchart illustrating a method of controlling a power supply apparatus according to an exemplary embodiment of the inventive concept. FIG. 10 is a flowchart illustrating operations to set values of first through M-th reference power signals in the method of FIG. 9 according to an exemplary embodiment of the inventive concept.

Referring to FIGS. 1 and 9, in a method of controlling the power supply apparatus 100 according to an exemplary embodiment of the inventive concept, the power supply apparatus 100 includes the first through M-th switching regulators 210a~210m, the first through N-th multiplexers 410a~410n, and the first through N-th linear regulators 510a~510n. The values of the first through N-th output power signals OPWR1~OPWRN that are to be generated by the first through N-th linear regulators 510a~510n are set based on the output control signal OCONT (operation S100). For example, as described with reference to FIG. 2, all of the output power signals OPWR1~OPWRN may be set to have different values. As another example, at least two of the output power signals OPWR1~OPWRN may be set to have the same value.

According to exemplary embodiments of the inventive concept, the number of the switching regulators 210a~210m may be different from the number of the linear regulators 510a~510n. For example, the number of the linear regulators 510a~510n may be greater than the number of the switching regulators 210a~210m.

The values of the first through M-th reference power signals RPWR1~RPWRM are set based on the reference control signal RCONT (operation S200).

Referring to FIGS. 1 and 10, to set the values of the first through M-th reference power signals RPWR1~RPWRM (e.g., to perform operation S200 in FIG. 9), the first through N-th output power signals OPWR1~OPWRN may be sorted based on the first criterion (operation S210). For example, the output power signals OPWR1~OPWRN may be sorted in order of their values. As described with reference to FIG. 3, the output power signals OPWR1~OPWRN may be sorted in ascending order.

The sorted first through N-th output power signals OPWR1~OPWRN may be divided into the first through M-th power signal groups based on the second criterion (operation S220). For example, the number of the power signal groups may be substantially the same as the number of the switching regulators 210a~210m, and each of the power signal groups may include at least one of the output power signals OPWR1~OPWRN. For example, as described with reference to FIG. 4, the output power signals OPWR1~OPWRN may be divided into M power signal groups such that the numbers of output power signals in power signal groups are substantially the same as one another, or may be divided into M power signal groups based on (M−1) threshold values.

The values of the first through M-th reference power signals RPWR1~RPWRM for the first through M-th power signal groups may be set based on the third criterion (operation S230). For example, as described with reference to FIG. 5, a value of each reference power signal may be set to be greater than a value of a maximum output power signal having a greatest value among output power signals included in each power signal group. For example, the value of each reference power signal may be obtained by adding an offset value to the value of the maximum output power signal of a corresponding power signal group. The values of the reference power signals RPWR1~RPWRM may be set to optimize efficiencies and minimize dropouts.

Referring back to FIGS. 1 and 9, the power selection signal PSEL is set such that the first through N-th multiplexers 410a~410n provide the first through N-th selection power signals SPWR1~SPWRN, respectively, that are optimized for the first through N-th linear regulators 510a~510n, respectively (operation S300). For example, as described with reference to FIG. 6, the first through M-th reference power signals RPWR1~RPWRM may be optimized for the first through N-th linear regulators 510a~510n. The selection signals S1~SN included in the power selection signal PSEL may be set such that each of the first through M-th reference power signals RPWR1~RPWRM is provided to a respective linear regulator.

According to exemplary embodiments of the inventive concept, at least one of the reference power signals RPWR1~RPWRM, the selection power signals SPWR1~SPWRN, and the output power signals OPWR1~OPWRN may be variable based on the reference control signal RCONT, the power selection signal PSEL, and the reference control signal OCONT. In other words, when applications and/or operating circumstances or environments of the power supply apparatus 100 are changed, operations S100, S200, and S300 may be repeated for optimizing the reference power signals, the selection power signals, and the output power signals.

The power supply apparatus 100 that operates based on the above-described method according to an exemplary embodiment of the inventive concept may be a hybrid power supply apparatus, and may include the first through N-th multiplexers 410a~410n of which the number is substantially the same as that of the first through N-th linear regulators 510a~510n. Accordingly, the power supply apparatus 100 may have higher efficiency, less heat generation, a small size, and simple structure, may have increased performance by optimizing the whole or overall dropouts of the first through N-th linear regulators 510a~510n, and may be dynamically controlled for optimizing the first through M-th reference power signals RPWR1~RPWRM and the first through N-th output power signals OPWR1~OPWRN.

The power supply apparatus 100 according to exemplary embodiments of the inventive concept may be included in various devices and systems. According to exemplary embodiments of the inventive concept, the power supply apparatus 100 may be included in any electronic system that includes a processor, a connectivity module, a memory device, a user interface, etc. The electronic system may be implemented as any mobile device, such as a mobile phone, a tablet computer, a laptop computer, a personal digital assistant (PDA), a portable multimedia player (PMP), a digital camera, a portable game console, a music player, a camcorder, a video player, a navigation system, a wearable device, an internet of things (IoT) device, an internet of everything (IoE) device, an e-book reader, a virtual reality (VR) device, an augmented reality (AR) device, etc., or any computing device, such as a personal computer (PC), a server computer, a workstation, a laptop computer, a digital television (TV), a set-top box, a robotic device, etc. According to exemplary embodiments of the inventive concept, the power supply apparatus 100 may be included in any test system for testing a plurality of devices under test (DUTs).

Figure 11:
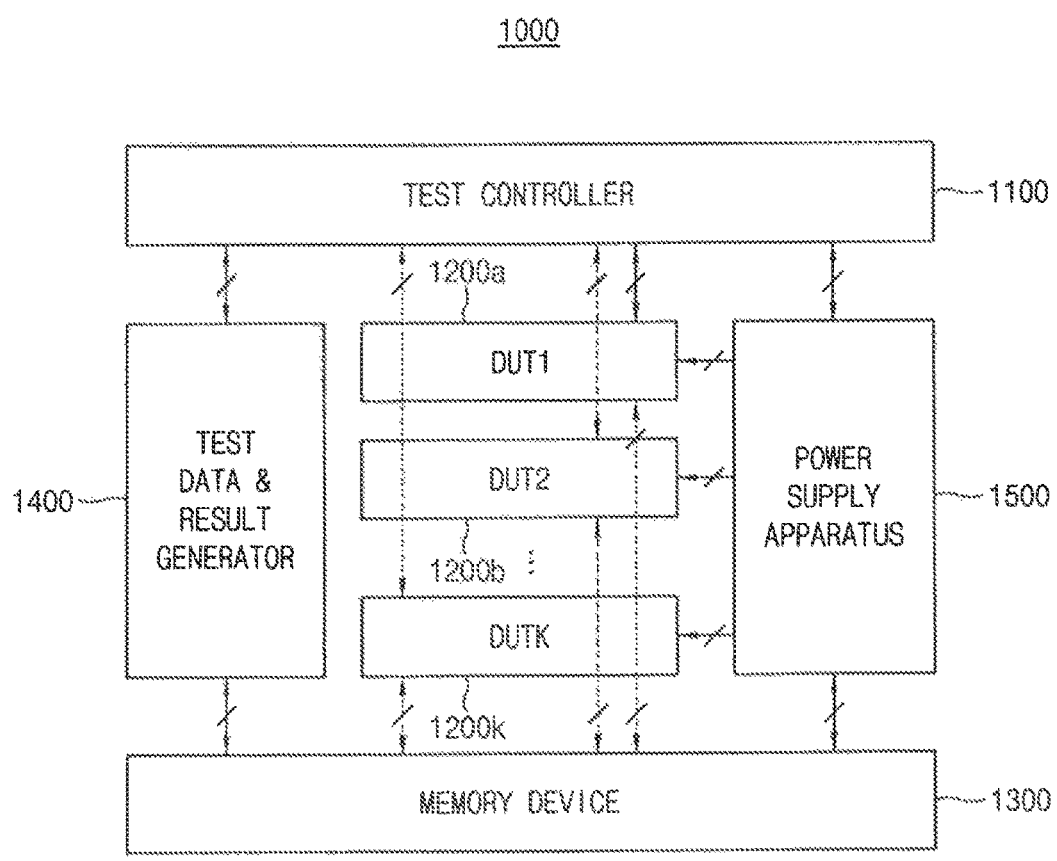
FIG. 11 is a block diagram illustrating a test system according to an exemplary embodiment of the inventive concept.

FIG. 11 is a block diagram illustrating a test system according to an exemplary embodiment of the inventive concept.

Referring to FIG. 11, a test system 1000 includes a test controller 1100, a plurality of DUTs 1200a, 1200b, . . . , 1200k, and a power supply apparatus 1500. The test system 1000 may further include a memory device 1300 and a test data & result generator 1400.

Each of the DUTs 1200a~1200k may be any integrated circuit. The test controller 1100 may control a test for each of the DUTs 1200a~1200k by controlling elements included in the test system 1000. The power supply apparatus 1500 may be a power supply apparatus as described above according to exemplary embodiments of the inventive concept (e.g., the power supply apparatus 100 of FIG. 1), and may provide at least a part of output power signals to each of the DUTs 1200a~1200k. The memory device 1300 may store data for the test. The test data & result generator 1400 may generate the test pattern that is applied to the DUTs 1200a~1200k, and may generate test results by comparing observed values output from the DUTs 1200a~1200k with a reference pattern.

According to exemplary embodiments of the inventive concept, the output power signals generated and provided from the power supply apparatus 1500 may be variable. For example, at least one of the output power signals may be changed to be optimized for the DUTs 1200a~1200k.

The inventive concept may be applied to various devices and systems that include a power supply apparatus. For example, the inventive concept may be applied to systems such as electronic systems, test systems, etc. that provide power signals to various integrated circuits.

As described above, according to exemplary embodiments of the inventive concept, the power supply apparatus may be a hybrid power supply apparatus in which the switching regulators and the linear regulators are connected in parallel with each other and are connected based on a multi-channel structure. To provide an optimized input to each of the linear regulators, the power supply apparatus may include the multiplexers of which the number is substantially the same as that of the linear regulators. Accordingly, the power supply apparatus may have higher efficiency, less heat generation, a small size, and a simple structure, and may have increased performance by optimizing the whole or overall dropouts of the linear regulators. In addition, when target power signals to be generated by the power supply apparatus are changed depending on applications and/or operating circumstances or environments, the power supply apparatus may be dynamically controlled for optimizing the reference power signals, the selection power signals, and the output power signals.

While the inventive concept has been shown and described with reference to exemplary embodiments thereof, it will be apparent to those of ordinary skill in the art that various changes and modifications in form and details may be made thereto without departing from the spirit and scope of the inventive concept as set forth in the following claims.

What is claimed is:

1. A power supply apparatus comprising:
    first through M-th switching regulators configured to generate first through M-th reference power signals using an input power signal, wherein M is a natural number greater than or equal to two;
    first through N-th multiplexers configured to select one of the first through M-th reference power signals, in response to a power selection signal, to provide first through N-th selection, power signals, wherein N is a natural number greater than or equal to two;
    first through N-th linear regulators configured to generate first through N-th output power signals using the first through N-th selection power signals, wherein the first through N-th linear regulators are connected to the first through N-th multiplexers, respectively; and
    a controller configured to generate a reference control signal, the power selection signal, and an output control signal,
    wherein values of the first through M-th reference power signals are set using the reference control signal, and
    wherein values of the first through N-th output power signals are set using the output control signal.

2. The power supply apparatus of claim 1, wherein, after the values of the first through N-th output power signals are set using the output control signal, the first through N-th output power signals are divided into first through M-th power signal groups, and then the values of the first through M-th reference power signals for the first through M-th power signal groups are set using the reference control signal.

3. The power supply apparatus of claim 2, wherein each of the first through M-th power signal groups includes at least one of the first through N-th output power signals.

4. The power supply apparatus of claim 3, wherein the value of the first reference power signal for the first power signal group is set to be greater than a value of a first maximum output power signal among the first through N-th output power signals, and
wherein the first maximum output power signal has a greatest value among output power signals included in the first power signal group.

5. The power supply apparatus of claim 4, wherein the value of the first reference power signal for the first power signal group is obtained by adding an offset value to the value of the first maximum output power signal.

6. The power supply apparatus of claim 2, wherein, before the first through N-th output power signals are divided into the first through M-th power signal groups, the first through N-th output power signals are sorted by value.

7. The power supply apparatus of claim 6, wherein the first through N-th output power signals includes a minimum output power signal having a smallest value and a maximum output power signal having a greatest value,
wherein one of the minimum output power signal and the maximum output power signal is included in the first power signal group, and
wherein the other of the minimum output power signal and the maximum output power signal is included in the M-th power signal group.

8. The power supply apparatus of claim 1, wherein the reference control signal, the power selection signal, and the output control signal are received from an external device.

9. The power supply apparatus of claim 1, wherein a total number of the first through M-th switching regulators is different from a total number of the first through N-th linear regulators.

10. The power supply apparatus of claim 9, wherein the total number of the first through N-th linear regulators is greater than the total number of the first through M-th switching regulators.

11. The power supply apparatus of claim 1, wherein the first switching regulator generates the first reference power signal using the input power signal,
wherein the first multiplexer outputs one of the first through M-th reference power signals as the first selection power signal using a first selection signal included in the power selection signal, and
wherein the first linear regulator generates the first output power signal using the first selection power signal.

12. The power supply apparatus of claim 11, wherein power loss dissipated by the first linear regulator increases in proportion to a voltage difference between the first output power signal and the first selection power signal.

13. A method of controlling a power supply apparatus, the method comprising:
setting values of first through N-th output power signals to be provided by first through N-th linear regulators in response to an output control signal, wherein N is a natural number greater than or equal to two;
setting values of first through M-th reference power signals to be provided by first through M-th switching regulators in response to a reference control signal, wherein M is a natural number greater than or equal to two; and
setting a power selection signal such that each of first through N-th multiplexers provides one of the first through M-th reference power signals as a selection power signal to one of the first through N-th linear regulators,
wherein setting values of the first through M-th reference power signals comprises:
sorting the first through N-th output power signals;
dividing the sorted first through N-th output power signals into first through M-th power signal groups; and
setting values of the first through M-th reference power signals according to the first through M-th power signal groups.

14. The method of claim 13, wherein the first through N-th output power signals are sorted by voltage value.

15. The method of claim 13, wherein the sorted first through N-th output power signals are divided into the first through M-th power signal groups by using first through (M−1)-th threshold values,
output power signals, among the sorted first through N-th output power signals, that have a voltage value less than the first threshold value are assigned to the first power signal group, and
output power signals, among the sorted first through N-th output power signals, that have a voltage value greater than or equal to the (M−1)-th threshold value are assigned to the M-th power signal group.

16. The method of claim 13, wherein values of the first through M-th reference power signals are set to be greater than values of first through M-th maximum output power signals, respectively, among the first through N-th output power signals,
the first maximum output power signal is an output power signal having a greatest value in the first power signal group, and
the M-th maximum output power signal is an output power signal having a greatest value in the M-th power signal group.

* * * * *